(12) United States Patent
Kanner et al.

(10) Patent No.: US 9,287,770 B1
(45) Date of Patent: Mar. 15, 2016

(54) ANALOG TIMER CIRCUIT WITH TIME CONSTANT MULTIPLICATION EFFECT

(71) Applicant: Martin Kanner, Plainview, NY (US)

(72) Inventors: Martin Kanner, Plainview, NY (US); Arthur Bauman, Smithtown, NY (US)

(*) Notice: Subject to any disclaimer, the term of this patent is extended or adjusted under 35 U.S.C. 154(b) by 0 days.

(21) Appl. No.: 14/613,505

(22) Filed: Feb. 4, 2015

Related U.S. Application Data

(60) Provisional application No. 62/124,776, filed on Jan. 2, 2015, provisional application No. 62/070,750, filed on Sep. 4, 2014.

(51) Int. Cl.
*H03B 1/00* (2006.01)
*H03K 3/00* (2006.01)
*H02M 3/07* (2006.01)

(52) U.S. Cl.
CPC ........................................ *H02M 3/07* (2013.01)

(58) Field of Classification Search
CPC ........... H03K 19/00361; H04L 25/028; H04L 25/0272
USPC ......... 327/108–112, 102, 141–163, 427, 434, 327/437, 306–333; 326/82, 83, 87
See application file for complete search history.

(56) References Cited

U.S. PATENT DOCUMENTS

| | | | |
|---|---|---|---|
| 3,821,650 A | 6/1974 | Kase et al. | |
| 3,831,117 A | 8/1974 | Fletcher et al. | |
| 3,987,764 A | 10/1976 | Scofield | |
| 4,692,598 A * | 9/1987 | Yoshida | G05D 23/1917 219/413 |
| 4,710,861 A | 12/1987 | Kanner | |
| 4,922,906 A * | 5/1990 | Takeuchi | A61N 1/36014 607/152 |
| 5,585,752 A | 12/1996 | Botti et al. | |
| 5,757,223 A | 5/1998 | Nevin | |
| 5,780,904 A | 7/1998 | Konishi et al. | |
| 5,898,328 A * | 4/1999 | Shoji | H03L 7/0891 327/147 |
| 5,900,771 A | 5/1999 | Bremner | |
| 5,945,870 A | 8/1999 | Chu et al. | |
| 6,194,903 B1 | 2/2001 | Schulz | |
| 6,344,772 B1 | 2/2002 | Larsson | |
| 7,382,634 B2 | 6/2008 | Buchmann | |
| 7,902,928 B2 | 3/2011 | Wang | |
| 8,629,700 B2 | 1/2014 | Feng et al. | |
| 2006/0244545 A1 | 11/2006 | Briskin et al. | |

(Continued)

FOREIGN PATENT DOCUMENTS

CA 1064582 10/1979
CN 203014674 U 6/2013

(Continued)

*Primary Examiner* — Lincoln Donovan
*Assistant Examiner* — Thomas Skibinski
(74) *Attorney, Agent, or Firm* — Ryan, Mason & Lewis, LLP

(57) ABSTRACT

An analog timer circuit comprises a pulse source, a charge storage element, and a charge pump coupled between the pulse source and the charge storage element. A pulse signal generated by the pulse source is utilized to charge the charge storage element via the charge pump. The analog timer may further comprise a discharge pump coupled between the pulse source and the charge storage element. The pulse signal generated by the pulse source is also utilized to discharge the charge storage element via the discharge pump. For example, the charge pump and the discharge pump may be driven by respective ones of complemented and uncomplemented versions of the pulse signal generated by the pulse source. An up/down driver circuit is configured to select between charging of the charge storage element via the charge pump and discharging of the charge storage element via the discharge pump.

21 Claims, 4 Drawing Sheets

(56) References Cited

U.S. PATENT DOCUMENTS

2008/0055808 A1    3/2008    Burkland et al.
2010/0315154 A1    12/2010    Tang

FOREIGN PATENT DOCUMENTS

| | | |
|---|---|---|
| GB | 1437544 | 5/1976 |
| GB | 1449243 | 9/1976 |
| JP | S57182684 A | 11/1982 |
| JP | S5997223 A | 6/1984 |
| JP | 2006080594 A | 3/2006 |
| JP | 2008203098 A | 9/2008 |
| JP | 2009147604 A | 7/2009 |
| KR | 910005608 B1 | 7/1991 |
| WO | 2014090136 A1 | 6/2014 |

* cited by examiner

ANALOG TIMER CIRCUIT WITH TIME CONSTANT MULTIPLICATION EFFECT

PRIORITY CLAIM

The present application claims the priority of U.S. Provisional Patent Application Ser. No. 62/070,750, filed Sep. 4, 2014 and entitled "Long Time Analog Up/Down Timer," and Ser. No. 62/124,776, filed Jan. 2, 2015 and also entitled "Long Time Analog Up/Down Timer," both of which are incorporated by reference herein.

FIELD

The field relates generally to electronic circuitry, and more particularly to electronic timer circuits.

BACKGROUND

A wide variety of electronic timer circuits are known in the art, including both analog timer circuits and digital timer circuits. Conventional analog timer circuits based on resistor-capacitor (RC) time constants are advantageous in that such circuits can be configured to provide a substantially continuous analog output and thus a large number of possible set points. However, such analog timer circuits can be problematic in applications in which relatively long time constants, on the order of tens, hundreds or thousands of seconds, are needed, as large and costly capacitors can be required.

Digital timer circuits based on digital counters overcome some of the disadvantages of analog timer circuits. For example, digital timer circuits can provide relatively long time constants. However, such digital timer circuits exhibit only a limited number of set points, corresponding to respective predetermined discrete output times, as compared to the much larger number of set points provided by the continuous analog output of an analog timer circuit. Moreover, digital timer circuits are generally more complex than analog timer circuits, and some of the digital circuit elements can be very costly.

Various techniques are also known for increasing the effective capacitance value of a given capacitive element. For example, the well-known Miller effect provides an increase in the effective capacitance of a given capacitor when the capacitor is used as a negative feedback element in a grounded-emitter bipolar transistor amplifier. In this configuration, the increase in effective capacitance approaches the current gain or beta of the transistor. A similar increase in effective capacitance can be achieved in an emitter-follower circuit in which the capacitor is connected between the base and collector of the bipolar transistor. As the maximum beta value for a bipolar transistor is typically about 100, the increase in effective capacitance in these and other similar conventional arrangements is at most about 100:1, which is generally insufficient to overcome the above-noted issues arising in conventional analog timer circuits based on RC time constants.

SUMMARY

Illustrative embodiments of the present invention provide simple and inexpensive analog timer circuits that exhibit an advantageous time constant multiplication effect. For example, a given embodiment can provide a long time constant, on the order of tens, hundreds or thousands of seconds, using a much smaller capacitance value than would be required in a conventional analog timer circuit based on a corresponding RC time constant. More particularly, in some of the illustrative embodiments, a time constant multiplication factor of up to 5000:1 or more is provided, such that an analog timer circuit providing relatively long time constants can be implemented using inexpensive components. Circuit reliability is also enhanced by the application of relatively low impedance circuit elements while achieving long time constants.

In one embodiment, an analog timer circuit comprises a pulse source, a charge storage element, and a charge pump coupled between the pulse source and the charge storage element. A pulse signal generated by the pulse source is utilized to charge the charge storage element via the charge pump.

The pulse signal may comprise an asymmetric pulse signal, with a charge time constant of the analog timer circuit being controllable through adjustment of at least one of a frequency and an asymmetry of the pulse signal.

The charge pump and charge storage element may comprise respective capacitive elements, with the charge time constant of the analog timer circuit being controllable through adjustment of relative capacitance values of the respective capacitive elements of the charge pump and the charge storage element.

The analog timer circuit may further comprise a charge distribution circuit coupled between the charge pump and the charge storage element. The charge distribution circuit comprises first and second circuit paths separating energy from the charge pump into respective first and second portions, with the first circuit path providing the first portion of the charge pump energy to the charge storage element, and the second circuit path diverting the second portion of the charge pump energy away from the charge storage element. In such an arrangement, the charge time constant of the analog timer circuit is controllable through adjustment of relative distribution of the charge pump energy between the first and second circuit paths.

The analog timer circuit may further comprise a discharge pump coupled between the pulse source and the charge storage element, with the pulse signal generated by the pulse source also being utilized to discharge the charge storage element via the discharge pump. For example, the charge pump and the discharge pump may be driven by respective ones of complemented and uncomplemented versions of the pulse signal generated by the pulse source.

Time constant adjustment mechanisms similar to those described above for the charge time constant may be provided in an analogous manner for a discharge time constant of the analog timer circuit.

An up/down driver circuit may be provided to select between charging of the charge storage element via the charge pump and discharging of the charge storage element via the discharge pump.

Other embodiments include, by way of example and without limitation, systems that implement feedback control utilizing an analog timer circuit.

Illustrative embodiments of the invention can provide significant advantages relative to conventional arrangements. For example, relatively long time constants can be provided using low capacitance and resistance values, and thus with significantly less cost and complexity than would otherwise be required. Also, an analog timer circuit in a given embodiment can be configured to allow for thousands of set points as compared to the limited number of outputs from a digital timer circuit.

DETAILED DESCRIPTION

Illustrative embodiments of the present invention will be described herein with reference to examples of analog timer circuits and systems that incorporate such circuits. It is to be appreciated, however, that embodiments of the invention are not restricted to use with the particular illustrative circuit and system configurations shown. For example, those skilled in the art will recognize that numerous alternative analog timer circuit configurations can be implemented utilizing the teachings provided herein.

Moreover, system embodiments of the invention are not limited to feedback control systems, but are more generally applicable to any type of system in which it is desirable to provide functionality that is based at least in part on an output of an analog timer circuit. Accordingly, the term "system" as used herein is intended to be broadly construed so as to encompass a wide variety of different devices or arrangements of multiple devices that utilize at least one analog timer circuit of the type disclosed herein.

Figure 1:
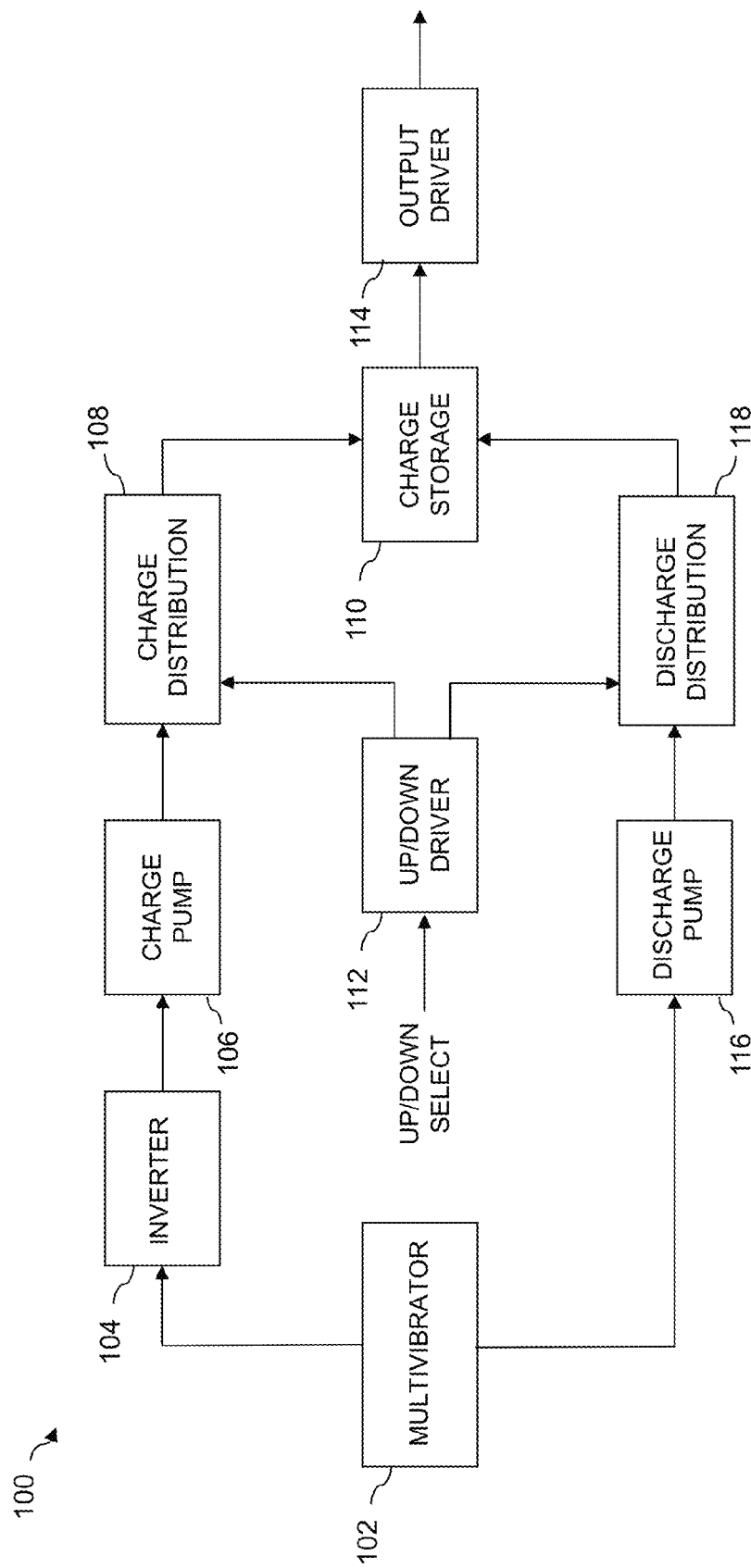
FIG. 1 is a block diagram of an analog timer circuit in an illustrative embodiment of the invention.

FIG. 1 shows a block diagram of an analog timer circuit 100 in one embodiment. The analog timer circuit 100 comprises an astable multivibrator 102 that is coupled via an inverter 104 to a charge pump 106. The analog timer circuit 100 further comprises a charge distribution circuit 108, a charge storage element 110, an up/down driver circuit 112, an output driver 114, a discharge pump 116 and a discharge distribution circuit 118.

The analog timer circuit 100 is advantageously configured to allow a given capacitive element comprising the charge storage element 110 to perform as if it were a much larger capacitive element. Accordingly, much longer time constants can be provided than would otherwise be possible using the given capacitive element. For example, it is possible in some embodiments to provide as much as a 5000 times increase or more in time constant length over that provided using a corresponding equivalent RC time constant arrangement. Embodiments of the invention therefore extend the time constant achievable using a given capacitive element by multiple orders of magnitude relative to conventional analog timer circuits based on RC time constants.

The analog timer circuit 100 is configured as an up/down timer circuit, in that it can selectively provide timing functionality based on charging of the charge storage element 110 and discharging of the charge storage element 110 in respective charge and discharge modes of operation of the analog timer circuit 100.

The up/down driver circuit 112 is configured to select between charging of the charge storage element 110 via the charge pump 106 and discharging of the charge storage element 110 via the discharge pump 116, responsive to an up/down select signal. More particularly, the up/down driver circuit 112 prevents the discharge pump energy from being delivered by the discharge distribution circuit 118 to the charge storage element 110 in the charge mode of operation, and prevents the charge pump energy from being delivered by the charge distribution circuit 108 to the charge storage element 110 in the discharge mode of operation, thereby controlling whether the charge on the charge storage element 110 will increase or decrease.

The output driver 114 is configured as an isolation driver which presents a high input impedance to the charge storage element 110 to prevent loading of the corresponding capacitive element. The output driver 114 also provides a low direct current (DC) output impedance for the analog timer circuit 100.

The output driver 114 in the present embodiment provides a substantially continuous analog output that can be slowly increasing or slowly decreasing, depending upon the selected charge or discharge mode of operation, and in accordance with the configured charge or discharge time constant.

By way of example, the output of the analog timer circuit 100 can be used in applications in which a control event is to be initiated after a relatively long delay. The output of the analog timer circuit can be compared to a preselected DC level and after the long delay the designated control event is initiated.

It is to be appreciated, however, that other types of analog timer circuit outputs can be provided in other embodiments.

A pulse signal generated by the astable multivibrator 102 is utilized to charge the charge storage element 110 via the charge pump 106, and to discharge the charge storage element 110 via the discharge pump 116. The astable multivibrator 102 is an example of what is more generally referred to herein as a "pulse source." Numerous other types of pulse sources may be used in other embodiments, such as, for example, a pulse generator.

The charge pump 106 and the discharge pump 116 in some embodiments are implemented as respective voltage source electrical energy pumps each comprising a single capacitive element, although numerous other types of charge and discharge pumps can be used in other embodiments. Charge and discharge pumps implemented using respective single capacitive elements are also referred to herein as capacitor charge pumps and capacitor discharge pumps, respectively.

Possible alternatives to the capacitor charge and discharge pumps utilized in certain embodiments include, for example, inductive charge or discharge pumps, in which energy from pulses of a pulse signal is inductively delivered to or removed from the charge storage element 110. Other arrangements involving provision of pulse energy to or from the charge storage element 110 can be used.

The pulse signal generated by the multivibrator 102 illustratively comprises an asymmetric pulse signal. More particularly, the pulse signal is assumed to comprise an asymmetric square wave. Other types of pulse signals can be used in other embodiments.

In the present embodiment, a charge time constant of the analog timer circuit 100 is controllable through adjustment of at least one of a frequency and an asymmetry of the pulse signal generated by the multivibrator 102.

The inverter 104 has its input coupled to an output of the multivibrator 102. The inverter 104 receives at its input an uncomplemented version of the pulse signal generated by the multivibrator 102 and provides at its output a complemented version of the pulse signal. Accordingly, the input of the charge pump 106 in this embodiment is driven by the complemented version of the pulse signal.

The charge pump 106 and the charge storage element 110 illustratively comprise respective capacitive elements.

The above-noted charge time constant of the analog timer circuit 100 is further controllable through adjustment of relative capacitance values of the respective capacitive elements of the charge pump 106 and the charge storage element 110.

Additional control of the charge time constant of the analog timer circuit 100 is provided by adjustment of the charge distribution circuit 108. For example, the charge distribution circuit 108 may comprise first and second circuit paths separating energy from the charge pump 106 into respective first and second portions, with the first circuit path providing the first portion of the charge pump energy to the charge storage element 110, and the second circuit path diverting the second portion of the charge pump energy away from the charge storage element 110. In one implementation of such an arrangement, the charge distribution circuit 108 illustratively dissipates part of the energy received from the charge pump 106 and feeds the remaining received charge pump energy to the charge storage element 110.

The charge time constant of the analog timer circuit 100 is then controllable through adjustment of relative distribution of the charge pump energy between the first and second circuit paths.

Accordingly, the charge time constant in the analog timer circuit 100 is controllable through adjustment of one or more of the following:

1. Frequency of the pulse signal generated by the multivibrator 102.
2. Asymmetry of the pulse signal generator by the multivibrator 102.
3. Relative capacitance values of the respective capacitive elements of the charge pump 106 and the charge storage element 110.
4. Relative distribution of the charge pump energy between the first and second circuit paths of the charge distribution circuit 108.

It is to be appreciated that a given embodiment may provide only a subset of the adjustability mechanisms described above, and possibly additional or alternative adjustment mechanisms.

A discharge time constant of the analog timer circuit 100 is controllable in a manner similar to that described above for the charge time constant.

More particularly, in this embodiment the charge pump 106 and the discharge pump 116 are driven by respective complemented and uncomplemented versions of the pulse signal generated by the multivibrator 102.

As a result, the discharge time constant of the analog timer circuit 100 is also controllable through adjustment of at least one of a frequency and an asymmetry of the pulse signal generated by the multivibrator 102.

It should be noted that the inverter 104 can instead be arranged between the multivibrator 102 and the discharge pump 116, rather than between the multivibrator 102 and the charge pump 106 as in the FIG. 1 embodiment, such that the charge pump and discharge pump are driven by respective uncomplemented and complemented versions of the pulse signal generated by the multivibrator 102.

Like the charge pump 106, the discharge pump 116 may comprise a capacitive element. The discharge time constant of the analog timer circuit 100 is then controllable through adjustment of relative capacitance values of the respective capacitive elements of the discharge pump 116 and the charge storage element 110.

Like the charge distribution circuit 108, the discharge distribution circuit 118 illustratively comprises first and second circuit paths separating energy from the discharge pump 116 into respective first and second portions, with the first circuit path providing the first portion of the discharge pump energy to the charge storage element 110, and the second circuit path diverting the second portion of the discharge pump energy away from the charge storage element 110. In one implementation of such an arrangement, the discharge distribution circuit 118 illustratively dissipates part of the energy received from the discharge pump 116 and feeds the remaining received discharge pump energy to the charge storage element 110.

The discharge time constant of the analog timer circuit 100 is then controllable through adjustment of relative distribution of the discharge pump energy between the first and second circuit paths.

Again, other embodiments can utilize only a subset of the particular adjustment mechanisms described above for controlling the discharge time constant of the analog timer circuit 100.

It should also be understood that the particular set of components implemented in the analog timer circuit 100 as illustrated in FIG. 1 are presented by way of example only. In other embodiments, only subsets of these components, or additional or alternative sets of components, may be used, and such components may exhibit alternative functionality and configurations.

For example, although configured in the FIG. 1 embodiment as an up/down timer, the analog timer circuit 100 in other embodiments can be reconfigured as an up-only timer by eliminating the up/down driver circuit 112, the discharge pump 116 and the discharge distribution circuit 118, and providing a reset mechanism for discharging the charge storage element 110 after a charging threshold is reached. Similarly, the analog timer circuit 100 in other embodiments can be reconfigured as a down-only timer by eliminating the up/down driver circuit 112, the charge pump 106 and the charge distribution circuit 108, and providing a reset mechanism for charging the charge storage element 110 after a discharging threshold is reached.

It should be noted in this regard that the term "analog timer circuit" as used herein is intended to be broadly construed, so as to encompass, for example, any timer circuit arrangement in which the primary timing mechanism is based on a substantially continuous analog signal. Accordingly, it is possible that a given analog timer circuit as disclosed herein may include a certain minimal number of digital components, such as, for example, digital switches for controlling switching between charge and discharge modes of operation, but such an analog timer circuit does not utilize digital timing circuitry such as digital counters for its primary timing mechanism.

Figure 2:
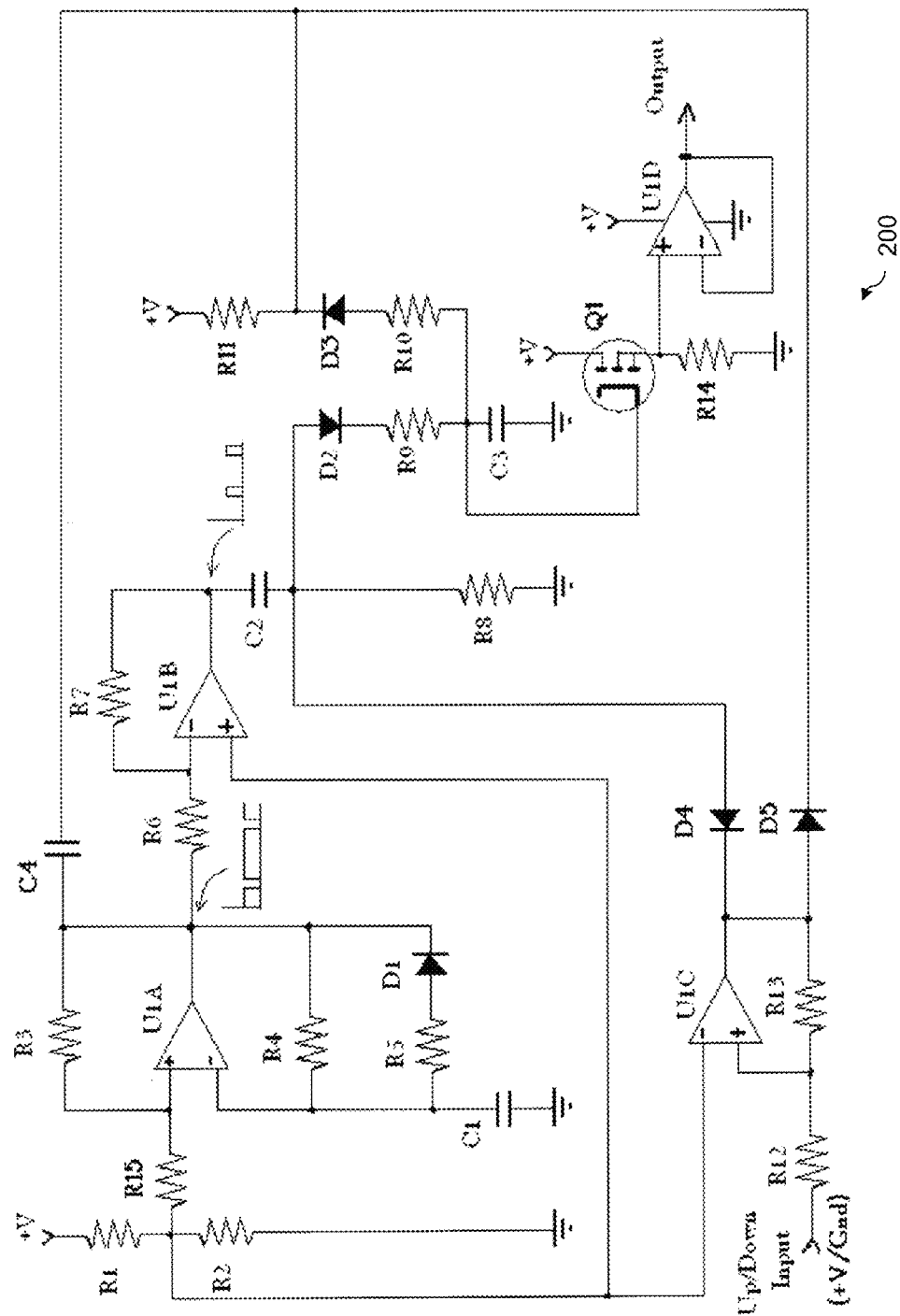
FIG. 2 is a schematic diagram showing one possible implementation of the analog timer circuit of FIG. 1.

Referring now to FIG. 2, an analog timer circuit 200 in accordance with another illustrative embodiment is shown. The analog timer circuit 200 may be viewed as a particular implementation of the analog timer circuit 100 previously described in conjunction with FIG. 1.

The analog timer circuit 200 comprises an astable multivibrator implemented using amplifier U1A, resistors R1, R2, R3, R4, R5 and R15, capacitor C1 and diode D1. The multivibrator generates an asymmetric square wave of the type shown at the output of the amplifier U1A. The asymmetric square wave is inverted by an inverter formed by amplifier U1B and resistors R6 and R7 and the resulting signal drives a capacitor charge pump implemented by capacitor C2. The analog timer circuit 200 operates from a supply voltage denoted +V.

The capacitor charge pump C2 is coupled through a charge distribution circuit to a charge storage element implemented by storage capacitor C3. The charge distribution circuit comprises resistors R8 and R9 and diode D2. Part of the positive output of capacitor charge pump C2 charges the storage capacitor C3 through D2 and R9. The charge rate is controlled by the ratio of the resistance values of resistors R8 and R9. The charge rate is also controlled by the ratio of the capacitance values of the capacitors C2 and C3, and by the frequency and asymmetry of the asymmetric square wave generated by the multivibrator.

The output of the multivibrator is also coupled to the storage capacitor C3 via a discharge pump C4 and a discharge distribution circuit comprising resistors R10 and R11 and diode D3.

The discharge rate is controlled by the ratio of the resistance values of resistors R10 and R11. The discharge rate is also controlled by the ratio of the capacitance values of the capacitors C3 and C4, and by the frequency and asymmetry of the asymmetric square wave generated by the multivibrator.

The analog timer circuit 200 further comprises an up/down driver circuit implemented using amplifier U1C, resistors R12 and R13, and diodes D4 and D5. The voltage at the upper terminal of the storage capacitor C3 will either increase or decrease based on the output state of amplifier U1C. More particularly, the U1C output state will be either high or low depending on the state of the up/down input signal applied to the non-inverting terminal of U1C via resistor R12. The inverting terminal of U1C receives a reference voltage established off the supply voltage +V by a divider comprising resistors R1 and R2. That reference voltage is also provided to the non-inverting terminal of U1B.

The up/down input signal illustratively takes on values of +V or ground potential to put the analog timer circuit 100 into respective charge or discharge modes of operation. A high output from U1C through diode D5 will prevent C4 from discharging C3 in the charge mode of operation, and a low output from U1C through diode D4 will prevent C2 from charging C3 in the discharge mode of operation.

The analog timer circuit 200 further includes an output driver. The output driver comprises a source follower circuit coupled to a unity-gain isolation amplifier U1D. The source follower circuit is implemented using a metal-oxide-semiconductor field effect transistor (MOSFET) Q1 and resistor R14. The gate of Q1 is coupled to upper terminal of storage capacitor C3. The drain of Q1 is coupled to the positive supply voltage +V. The source follower circuit presents a very high impedance to the storage capacitor C3. The unity-gain isolation amplifier U1D further provides a high impedance to the output of Q1 and a low impedance at its output. Considering the small energy pulses delivered by the charge and discharge pumps in this embodiment, the output of U1D can be considered to be substantially continuously varying with time.

As a more particular example, the analog timer circuit 200 can be configured utilizing the components and values listed below. These particular components and values should not be viewed as limiting in any way and can be varied in other embodiments.

| | |
|---|---|
| U1A, B, C, D | LM324 quad op-amp |
| Q1 | IRFF430 MOSFET |
| C1 | CK05BX104, 0.1 µfd, 50 VDC |
| C2, C4 | CK05BX103, 0.01 µfd, 100 VDC |
| C3 | C430C225K5HA, 2.2 µfd, 50 VDC |
| D1-D5 | 1N4148 low-leakage signal diode |
| R1, R2, R6, R12 | 10 KΩ |
| R3, R13, R15 | 100 KΩ |
| R4 | 2.2 MΩ |
| R5 | 270 KΩ |
| R7 | 22 KΩ |
| R8, R11, R14 | 33 KΩ |
| R9, R10 | 470 KΩ |

All of the resistors listed above are assumed to be 0.1 watt rated, 5% tolerance metal film resistors.

Using the particular components and values given above, the analog timer circuit 200 provides a charge time constant of about 2340 seconds. Since R9 and C3 are 470 KΩ and 2.2 microfarads (pfd), respectively, the corresponding RC time constant for these values is about 1.03 seconds. Accordingly, this example configuration provides a time constant multiplication factor of about 2270:1.

An alternative configuration using values of 10 KΩ and 100 KΩ for R8 and R9, respectively, while keeping C3 at 2.2 µfd, provides a charge time constant of about 2160 seconds. The corresponding RC time constant for these values is about 0.22 seconds. Accordingly, this alternative configuration provides a time constant multiplication factor of 9818:1.

Further control of the charge time constant in the analog timer circuit 200 can be provided by adjusting the value of capacitor C2 relative to that of capacitor C3. More particularly, the charge time constant varies inversely with the value of the capacitor C2 for a given value of capacitor C3. Also, varying the frequency and/or asymmetry of the pulse signal generated by the multivibrator can be used to control the charge time constant.

Similar time constant adjustment mechanisms are provided for the discharge time constant using the discharge portions of the analog timer circuit 200, including resistors R10 and R11 and capacitor C4.

Those skilled in the art will recognize that a wide variety of other time constant multiplication factors can be provided in a straightforward manner for charge or discharge portions of the analog timer circuit 200, as appropriate for a given application.

It should also be noted that the charge time constant multiplication effect need not be substantially the same as the discharge time constant multiplication effect. The discharge time constant can be made different from the charge time constant by, for example, configuring the analog timer circuit 200 such that R8 is not equal to R11 and/or C2 is not equal to C4. Additionally or alternatively, different pulse signals with different frequency and/or asymmetry characteristics from different multivibrators can be used for the respective charge and discharge portions of the analog timer circuit.

It is to be appreciated that the analog timer circuit embodiments described above are presented by way of example only. Numerous alternative embodiments can be configured using additional or alternative components in other configurations. Accordingly, although illustrative embodiments of analog timer circuits have been described with reference to FIGS. 1 and 2, it is to be understood that analog timer circuits in accordance with the invention are not limited to those precise embodiments, and that various other changes and modifications may be effected by one skilled in the art without departing from the scope or spirit of the invention.

Examples of feedback control systems incorporating an analog timer circuit in accordance with embodiments of the invention will now be described in more detail with reference to FIGS. 3 and 4. These systems are illustratively configured for controlling temperature of a heat/cold chamber and for controlling speed of a motor, respectively. The heat/cold chamber and the motor are examples of what are more generally referred to herein as "controlled components."

Figure 3:
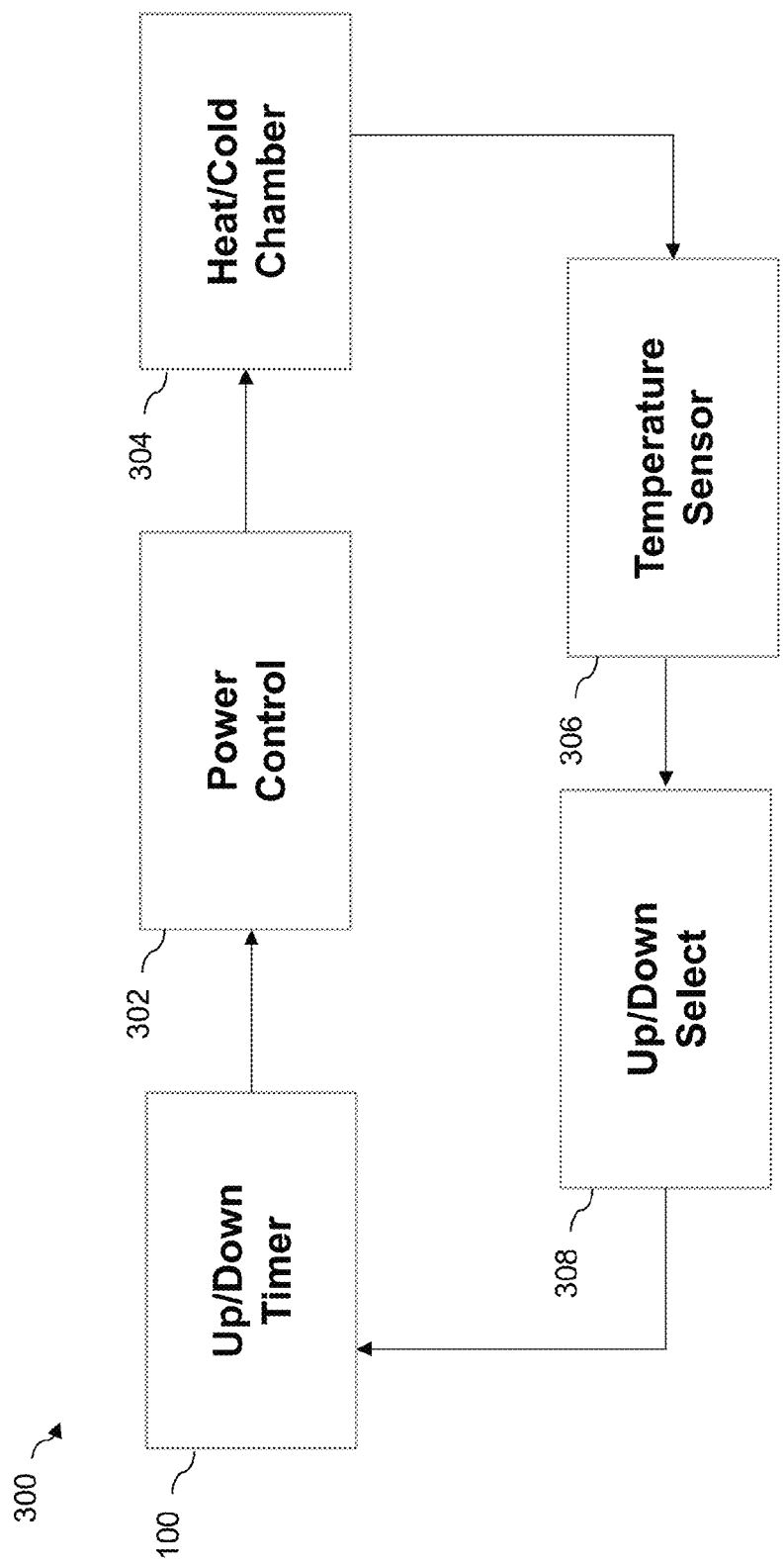
FIGS. 3 and 4 show respective illustrative embodiments of feedback control systems incorporating an analog timer circuit of the type described in conjunction with FIGS. 1 and 2.

Referring first to FIG. 3, a feedback control system 300 comprises analog timer circuit 100 and a power control circuit 302. The analog timer circuit 100 is assumed to be configured as an up/down timer, with charge and discharge modes of operation, as previously described in conjunction with FIG. 1. The power control circuit 302 has an input coupled to an output of the analog timer circuit 100.

The controlled component in this embodiment comprises a heat/cold chamber 304. The heat/cold chamber 304 has an input coupled to an output of the power control circuit 302. The heat/cold chamber 304 is illustratively configured for use in long-term temperature cycling of electronic components for reliability testing or normalization purposes, or other temperature cycling arrangements that utilize relatively long time constants.

The feedback control system 300 further comprises a temperature sensor 306 having an input coupled to an output of the heat/cold chamber 304 and an output coupled to an input of the analog timer circuit 100 via an up/down select circuit 308. The temperature sensor 306 is an example of what is more generally referred to herein as a "sensor circuit."

The up/down select circuit 308 coupled between the temperature sensor 306 and the analog timer circuit 100 is configured to control selection between charge and discharge modes of operation of the analog timer circuit 100, responsive to an output signal generated by the temperature sensor 306.

Figure 4:
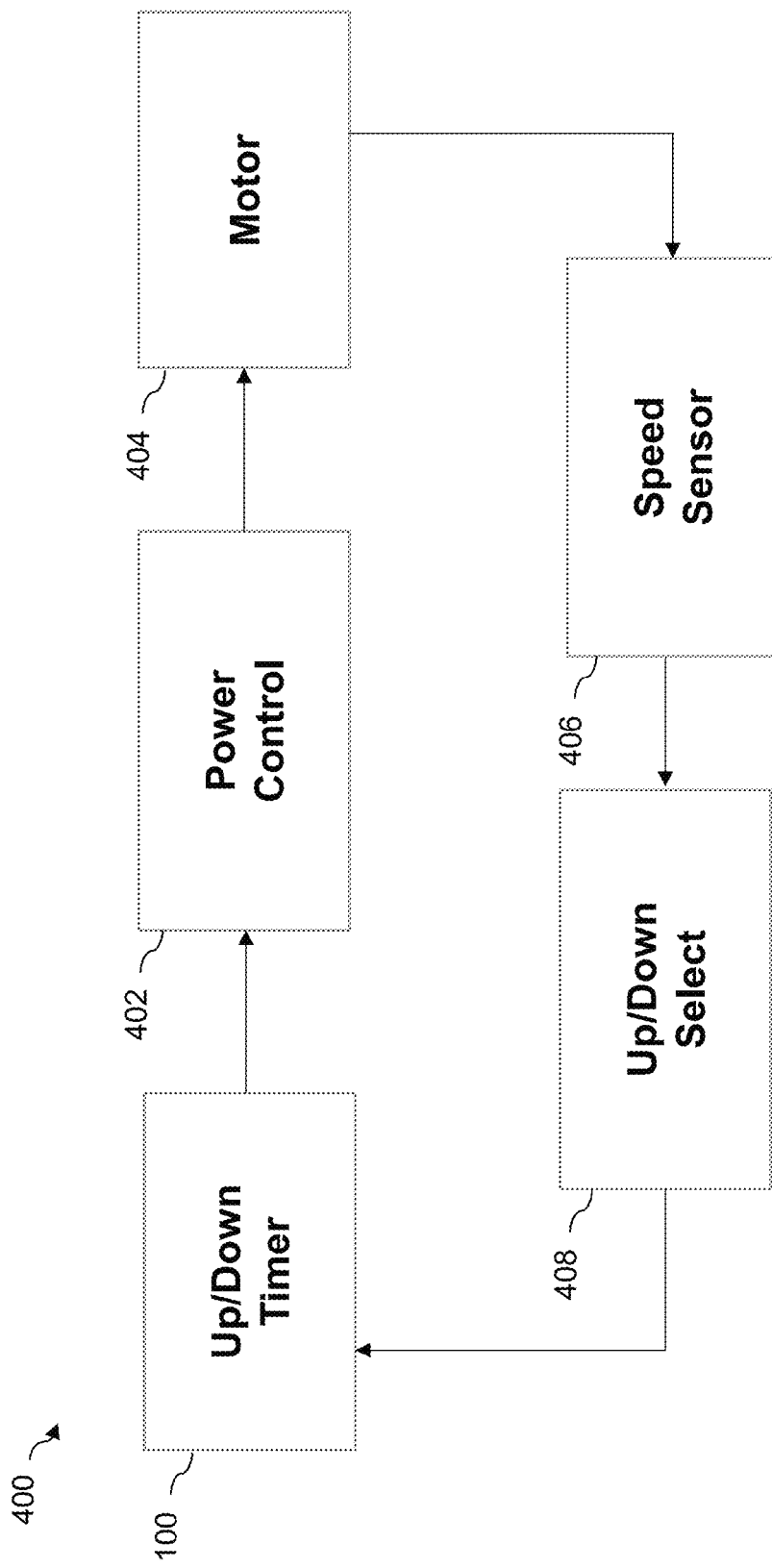

The FIG. 4 embodiment operates in a manner similar to the FIG. 3 embodiment, but the controlled component in this embodiment is a motor. Such an arrangement can be utilized, for example, for long-term testing of the motor. A feedback control system 400 comprises analog timer circuit 100 configured as an up/down timer, a power control circuit 402, a controlled component comprising a motor 404, a sensor circuit comprising a speed sensor 406, and an up/down select circuit 408. The up/down select circuit 408 is configured to control selection between charge and discharge modes of operation of the analog timer circuit 100, responsive to an output signal generated by the speed sensor 406.

It is also to be appreciated that the particular control systems illustrated in FIGS. 3 and 4 are exemplary only, and numerous other system arrangements incorporating an analog timer circuit may be used in other embodiments. For example, the disclosed techniques may be adapted in a straightforward manner for providing analog timer circuits with relatively long time constants in a wide variety of other system applications. Such applications can illustratively include any type of system in which a substantially continuous slowly increasing or decreasing analog timer output is needed.

It should again be emphasized that the above-described embodiments of the invention are presented for purposes of illustration only. Many variations and other alternative embodiments may be used. For example, the disclosed techniques are applicable to a wide variety of other types of circuits and systems. Also, the particular configurations of circuit and system elements shown in FIGS. 1 through 4 can be varied in other embodiments. Thus, for example, the particular types and arrangements of pulse sources, charge and discharge pumps, charge storage elements and other components deployed in a given embodiment and their respective configurations may be varied. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An analog timer circuit comprising:
a pulse source;
a charge storage element;
a charge pump coupled between the pulse source and the charge storage element; and
a charge distribution circuit coupled between the charge pump and the charge storage element;
wherein the charge distribution circuit comprises first and second circuit paths separating energy from the charge pump into respective first and second portions;
the first circuit path providing the first portion of the charge pump energy to the charge storage element; and
the second circuit path diverting the second portion of the charge pump energy away from the charge storage element;
wherein a pulse signal generated by the pulse source is utilized to charge the charge storage element via the charge pump.

2. The analog timer circuit of claim 1 wherein the pulse source comprises an astable multivibrator.

3. The analog timer circuit of claim 1 wherein the pulse signal comprises an asymmetric pulse signal.

4. The analog timer circuit of claim 1 wherein a charge time constant of the analog timer circuit is controllable through adjustment of at least one of a frequency and an asymmetry of the pulse signal generated by the pulse source.

5. The analog timer circuit of claim 1 further comprising:
an inverter having an input coupled to an output of the pulse source;
the inverter receiving at its input an uncomplemented version of the pulse signal generated by the pulse source and providing at its output a complemented version of the pulse signal;
wherein the input of the charge pump is driven by one of the complemented and uncomplemented versions of the pulse signal.

6. The analog timer circuit of claim 1 wherein the charge pump and charge storage element comprise respective capacitive elements.

7. The analog timer circuit of claim 6 wherein a charge time constant of the analog timer circuit is controllable through adjustment of relative capacitance values of the respective capacitive elements of the charge pump and the charge storage element.

8. The analog timer circuit of claim 1 wherein a charge time constant of the analog timer circuit is controllable through adjustment of relative distribution of the charge pump energy between the first and second circuit paths.

9. The analog timer circuit of claim 1 further comprising:
a discharge pump coupled between the pulse source and the charge storage element;
wherein the pulse signal generated by the pulse source is utilized to discharge the charge storage element via the discharge pump.

10. The analog timer circuit of claim 9 further comprising:
an up/down driver circuit configured to select between charging of the charge storage element via the charge pump and discharging of the charge storage element via the discharge pump.

11. The analog timer circuit of claim 9 wherein the charge pump and the discharge pump are driven by respective ones of complemented and uncomplemented versions of the pulse signal generated by the pulse source.

12. The analog timer circuit of claim 9 wherein the discharge pump and charge storage element comprise respective capacitive elements.

13. The analog timer circuit of claim 12 wherein a discharge time constant of the analog timer circuit is controllable through adjustment of relative capacitance values of the respective capacitive elements of the discharge pump and the charge storage element.

14. The analog timer circuit of claim 1 wherein respective complemented and uncomplemented versions of the pulse signal generated by the pulse source are utilized to charge the charge storage element in a charge mode of operation and to discharge the charge storage element in a discharge mode of operation.

15. An analog timer circuit comprising:
a pulse source;
a charge storage element; and
a charge pump coupled between the pulse source and the charge storage element;
wherein a pulse signal generated by the pulse source is utilized to charge the charge storage element via the charge pump;
wherein the analog timer circuit further comprises:
a discharge pump coupled between the pulse source and the charge storage element; and
a discharge distribution circuit coupled between the discharge pump and the charge storage element;
wherein the discharge distribution circuit comprises first and second circuit paths separating energy from the discharge pump into respective first and second portions;
the first circuit path providing the first portion of the discharge pump energy to the charge storage element; and
the second circuit path diverting the second portion of the discharge pump energy away from the charge storage element;
wherein the pulse signal generated by the pulse source is utilized to discharge the charge storage element via the discharge pump.

16. The analog timer circuit of claim 15 wherein a discharge time constant of the analog timer circuit is controllable through adjustment of relative distribution of the discharge pump energy between the first and second circuit paths.

17. A system comprising:
an analog timer circuit;
a power control circuit having an input coupled to an output of the analog timer circuit;
a controlled component having an input coupled to an output of the power control circuit; and
a sensor circuit having an input coupled to an output of the controlled component and an output coupled to an input of the analog timer circuit;
the analog timer circuit comprising:
a pulse source;
a charge storage element;
a charge pump coupled between the pulse source and the charge storage element; and
a charge distribution circuit coupled between the charge pump and the charge storage element;
wherein the charge distribution circuit comprises first and second circuit paths separating energy from the charge pump into respective first and second portions;
the first circuit path providing the first portion of the charge pump energy to the charge storage element; and
the second circuit path diverting the second portion of the charge pump energy away from the charge storage element;
wherein a pulse signal generated by the pulse source is utilized to charge the charge storage element via the charge pump.

18. The system of claim 17 wherein the controlled component comprises a heat/cold chamber and the sensor circuit comprises a temperature sensor.

19. The system of claim 17 wherein the controlled component comprises a motor and the sensor circuit comprises a speed sensor.

20. The system of claim 17 further comprising an up/down select circuit coupled between the sensor and the analog timer circuit and configured to control selection of charge and discharge modes of operation of the analog timer circuit responsive to a sensor output signal generated by the sensor circuit.

21. The system of claim 17 wherein the analog timer circuit further comprises:
a discharge pump coupled between the pulse source and the charge storage element; and
a discharge distribution circuit coupled between the discharge pump and the charge storage element;
wherein the discharge distribution circuit comprises first and second circuit paths separating energy from the discharge pump into respective first and second portions;
the first circuit path providing the first portion of the discharge pump energy to the charge storage element; and
the second circuit path diverting the second portion of the discharge pump energy away from the charge storage element;
wherein the pulse signal generated by the pulse source is utilized to discharge the charge storage element via the discharge pump.

\* \* \* \* \*